United States Patent
Tani et al.

(10) Patent No.: US 7,605,965 B2
(45) Date of Patent: Oct. 20, 2009

(54) OPTICAL DEFLECTOR

(75) Inventors: Masanao Tani, Kanagawa (JP);
Yoshiaki Yasuda, Kanagawa (JP);
Masahiro Akamatsu, Kanagawa (JP);
Takanori Aimono, Kanagawa (JP)

(73) Assignee: Stanley Electric Co., Ltd. (JP)

( * ) Notice: Subject to any disclaimer, the term of this patent is extended or adjusted under 35 U.S.C. 154(b) by 0 days.

(21) Appl. No.: 12/355,044

(22) Filed: Jan. 16, 2009

(65) Prior Publication Data

US 2009/0180167 A1 Jul. 16, 2009

(30) Foreign Application Priority Data

Jan. 16, 2008 (JP) ............... 2008-006950

(51) Int. Cl.
*G02B 26/08* (2006.01)

(52) U.S. Cl. .............. 359/224.1; 359/199.1; 359/199.4; 359/200.8; 310/331

(58) Field of Classification Search .... 359/224.1–224.2
See application file for complete search history.

(56) References Cited

U.S. PATENT DOCUMENTS

2003/0168942 A1* 9/2003 Iino et al. ................. 310/331
2008/0297868 A1* 12/2008 Mizumoto ................. 359/199

FOREIGN PATENT DOCUMENTS

| JP | 2001-234331 A1 | 8/2001 |
| JP | 2002-177765 A1 | 6/2002 |
| JP | 2003-81694 A1 | 3/2003 |
| JP | 2004-034256 A | 2/2004 |
| JP | 2004-264702 A | 9/2004 |
| JP | 2004-347713 A1 | 12/2004 |

* cited by examiner

*Primary Examiner*—James Phan
(74) *Attorney, Agent, or Firm*—Chen Yoshimura LLP

(57) ABSTRACT

An optical deflector includes a mirror having a reflective plane; a torsion bar extending outwardly from a side of said mirror; a support surrounding said mirror; a piezoelectric cantilever including a supporting body and a piezoelectric body formed on the supporting body, one end of said piezoelectric cantilever being connected to said torsion bar, the other end of the piezoelectric cantilever being connected to said support, said piezoelectric cantilever, upon application of a driving voltage to the piezoelectric body, exhibiting a bending deformation due to piezoelectricity so as to rotate said torsion bar, thereby rotarily driving said mirror through said torsion bar; and an impact attenuator connected to said support, the impact attenuator being disposed in a gap between said mirror and said support.

7 Claims, 6 Drawing Sheets

OPTICAL DEFLECTOR

BACKGROUND OF THE INVENTION

1. Field of the Invention

The present invention relates to an optical deflector for deflecting and sweeping a light beam such as a laser beam.

2. Description of the Related Art

Recently, an optical deflector, in which a mirror and piezoelectric actuators are formed integrally on a semiconductor substrate, has been proposed as a MEMS (micro electro mechanical systems) device using semiconductor processes and micro machining technology. In the optical deflector, one end of a piezoelectric actuator is linked to and supported by a frame part (a support part), and a torque, which is generated by an piezoelectric actuator, is transmitted to a torsion bar (an elastic beam) which is in turn connected to other end of the piezoelectric actuator, thereby rotarily driving a mirror attached to an end of the torsion bar. Advantages of such an optical deflector are: such an optical deflector is small in size, is simply structured, provides a large driving force, and is easy to be manufactured and mass-produced.

Because such an optical deflector has movable parts (torsion bars, piezoelectric actuators), the optical deflector may malfunction due to external vibrations, or be damaged by external impacts. One way to buffer the external vibrations or impacts is to cover a whole module that mounts the optical deflector with a cushioning material. But if one attempts to cover the module having the mounted optical deflector with a cushioning material, the overall size of the module becomes large, and the advantages of MEMS devices, such as being small in size and having high functionality, would be lost. For this reason, various techniques have been proposed to equip the optical deflector itself with a buffering mechanism that fights against vibrations and impacts. For example, movable parts of the optical deflector may be structured rigid and virtually indestructible. In another example, the optical deflector may be equipped with a buffering mechanism to absorb vibrations and impacts (See, e.g., Patent Documents 1-3). In the optical deflector in Patent Documents 1 and 2, a cross-sectional shape of a torsion bar is designed in such a way as to buffer vibrations and impacts. In the optical deflector in Patent Document 3, a cushioning material is directly glued to a fixing frame which touches the bottom side of the device.

(Patent Document 1) Japanese Laid-open Patent Application: Publication No.: 2004-034256.

(Patent Document 2) Japanese Laid-open Patent Application: Publication No.: 2004-264702.

(Patent Document 3) Japanese Laid-open Patent Application: Publication No.: 2004-347713.

But if the torsion bar is structured rigid, the rigidity of the torsion bar increases, resulting in a reduced maximum deflection angle. On the other hand, if the cross-sectional shape of the torsion bar is designed to be less prone to a destruction as in the cases of Patent Document Nos. 1 and 2, the number of manufacturing steps is increased in order to form a more complex structure, and the yield is reduced due to the required higher precision manufacturing.

In the optical deflector of Patent Documents 3, a cushioning material is glued to the bottom surface of a fixing frame. However, because the optical deflector has movable parts, the area of the fixing frame (an area for gluing the cushioning material) relative to the entire bottom surface of the device is limited, and therefore, it is difficult to obtain sufficient cushioning effects against the external vibrations and impacts. Moreover, in optical deflectors, the mirror is often damaged by a collision of the mirror to the fixing frame when the external vibrations and impacts are transmitted to the mirror through the torsion bars to cause abnormal vibration in the mirror. In the optical deflector of the Patent Documents 3, it is difficult to avoid this type of damage of the mirror by the collision with the fixing frame when the mirror is vibrated abnormally.

Furthermore, in silicon based MEMS devices, because of the large difference between the thermal expansion coefficients of the silicon and the cushioning material (such as rubber), a large stress is generated on the interface depending on the surrounding temperature. Therefore, in the optical deflector which has the glued cushioning material as in the Patent Documents 3, the deflection and sweeping/scanning performance of the deflection device may suffer due to the stress which is caused by the cushioning material.

SUMMARY OF THE INVENTION

Accordingly, the present invention is directed to an optical deflector that substantially obviates one or more of the problems due to limitations and disadvantages of the related art.

An object of the present invention is to provide an optical deflector capable of effectively avoiding breakage failure or abnormal operations without increasing the device size or sacrificing its deflection and sweeping/scanning performance.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, according to a first aspect of the present invention, there is provided an optical deflector including a mirror having a reflective plane, a torsion bar extending outwardly from an end of the mirror, a support disposed so as to surround the mirror, a first piezoelectric actuator having one or more piezoelectric cantilevers, the cantilever including a piezoelectric material formed on a supporting body to exhibit flexion deformity due to piezoelectricity when a driving voltage is applied thereto, one end of the piezoelectric actuator being connected to the torsion bar, the other end of the piezoelectric actuator being connected to the support, a characteristic impact attenuator being installed in the gap between the mirror and the support part.

According to this aspect of the present invention, because the impact attenuator is disposed between the mirror and the support, even if external vibrations or impacts are transmitted to the mirror through the torsion bar and the mirror vibrates abnormally, the mirror will contact the impact attenuator. Therefore a breakage failure caused by the collision of the mirror to the support is avoided and the abnormal vibration of the mirror is weakened. Here, because the impact attenuator is connected to the support, the normal rotary drive of the mirror is not affected and the normal performance of the deflection and the sweeping remains intact. Also because the impact attenuator is installed in a gap between the mirror and the support, the size of the optical deflector device is not increased. Therefore, the breakage failure can be avoided effectively by buffering vibrations and impacts without significantly increasing the device size or sacrificing the deflection and sweeping/scanning performance.

In a second aspect, it is preferred that the impact attenuator in the optical deflector of the first aspect of the present invention is shaped so as to possess spring characteristics and is formed integrally with the support through a patterning process of a semiconductor substrate.

In the optical deflector of the second aspect, because the impact attenuator is shaped to possess spring characteristics, even if the mirror vibrates abnormally and touches the impact attenuator, impacts are weakened and brakeage failure of the mirror and the impact attenuator is avoided. Also, because the impact attenuator is formed integrally by a pattern formation process(es), there is no need for a joint member or glue which would be required if individually formed parts were to be assembled by the processes of cementing or gluing. Also, the alignment precision is improved, and the device can be formed easily and precisely.

Further, because the impact attenuator and the support is connected mechanically by integrally forming them together, the connecting part has a less concentrated stress than the connecting part of the device that is formed by joining separately formed parts together. Therefore, the durability of the impact attenuator is improved. Further, because the impact attenuator is formed from a semiconductor substrate, the impact attenuator can be formed easily and simultaneously using a semiconductor planer process and manufacturing processes of the micro machining technology.

In a third aspect, the impact attenuator is formed by patterning processes using the photolithography process on an elastic photosensitive polymer material.

According to the optical deflector of the third aspect, because the impact attenuator is formed by processing an elastic photosensitive polymer material, even if the mirror vibrates abnormally and touches the impact attenuator, the impacts are weakened and a brakeage failure of the mirror and the impact attenuator is avoided. Because the impact attenuator is formed by the patterning method using the photolithography process on a photosensitive polymer material, the impact attenuator can be formed easily by inserting a forming process for the impact attenuator into the manufacturing process of the optical deflector using a semiconductor planer process and manufacturing processes of the micro machining technology.

In a fourth aspect, it is preferred that on the side of the gap of the mirror of the optical deflector of the third aspect, at least one protruding portion having a predetermined size is formed so as to face the impact attenuator in a manner that does not obstruct the rotary drive of the mirror.

In the optical deflector of the third aspect, the impact attenuator formed by a polymer material has a chance to cause a sticktion through adhesion to the mirror when the mirror accidentally touches impact attenuator. The fourth aspect of the present invention avoids this potential problem by having a protruding portion. The protruding portion has a predetermined size, faces the impact attenuator, and does not obstruct the rotary drive of the mirror. Because of this, it is possible to prevent the sticktion that would otherwise occur through adhesion of the mirror to the impact attenuator, thereby preventing degradation of the deflection and sweeping performance of the optical deflector due to the sticktion.

In the optical deflector of any one of the first through fourth aspects, it is preferred that one or two pairs of the piezoelectric actuators are installed to face each other across the mirror and across a pair of the torsion bars that extend outwardly from both sides of the mirror. At least one end of each piezoelectric actuator is connected to the torsion bar, and the other end is connected to and supported by the support. As a result, the mirror is driven rotarily by the one pair or two pairs of the piezoelectric actuators (the fifth aspect).

According to the optical deflector of the fifth aspect, one pair or two pairs of the piezoelectric actuators are installed across the mirror and the torsion bars, and the mirror can be driven rotarily around one axis by driving the piezoelectric actuators. Therefore, it is possible to perform stable deflection and sweeping/scanning operations around one rotational axis. And even if abnormal vibrations occur due to the external vibrations or impacts, a brakeage failure of the mirror by the collision of the mirror to the support is avoided and the abnormal vibration is weakened by having the impact attenuator.

Alternatively, in the optical deflector of any one of the first through fourth aspects, it is preferred that one pair or two pairs of the first piezoelectric actuators are installed across the mirror and a pair of the first torsion bars extending outwardly from the mirror, at least one end of each first piezoelectric actuator is connected to the first torsion bar and the other end of the first piezoelectric actuator is connected to and supported by the inside of the movable frame surrounding the mirror, one or two pairs of the second piezoelectric actuators are installed along the direction different from the direction of the first piezoelectric actuators across the mirror and the movable frame and the second torsion bars extending towards outside from the movable frame, at least one end of the second piezoelectric actuator is connected to the second torsion bar and the other end of the second piezoelectric actuator is connected to and supported by the support surrounding the movable frame, and the mirror is rotarily driven by one pair or two pairs of the first piezoelectric actuators around the first axis along the first torsion bar as well as the mirror is driven rotarily by one pair or two pairs of the second piezoelectric actuators about the second axis different from the first axis through the second torsion bar. The impact attenuators includes a first impact attenuator which exists in the first gap between the mirror and the movable frame and which is connected to the movable frame, and a second attenuator which exists in a second gap between the movable frame and the support and which is connected to the support (the sixth aspect).

In the optical deflector of the sixth aspect, one pair or two pairs of the inner first piezoelectric actuators are installed across the mirror, and the mirror can be rotarily driven by the inner first piezoelectric actuators around the first axis. Furthermore, independently and simultaneously one or two pairs of the second piezoelectric actuators are installed across the movable frame, the movable frame as well as the mirror and the first actuators can be integrally rotarily driven by the second piezoelectric actuators around the second axis. This way, the mirror can be driven rotarily about two axes, and the stable deflection and scanning performance can be achieved in the two directions.

In this case, because of the first impact attenuators in the first gap between the mirror and the movable frame, even if external vibrations and impacts are transmitted through the first torsion bars and the mirror vibrates abnormally, a brakeage failure of the mirror by a collision of the mirror and the movable frame is avoided, and the abnormal vibration of the mirror is weakened. And because of the second impact attenuators in the second gap between the movable frame and the support, even if external vibrations and impacts are transmitted through the second torsion bars and the movable frame vibrates abnormally, a brakeage failure of the movable frame by a collision of the movable frame and the support is avoided, and the abnormal vibration of the movable frame is weakened.

In the optical deflector of the fifth and sixth aspects, it is preferred that an applied driving voltage to one pair or two pairs of piezoelectric actuators is alternating current voltage (the seventh aspect).

In the optical deflector of the seventh aspect, sweeping of the light can be done by the rotary oscillation of the mirror around the central axis along the torsion bar by using the drive of each pair of the piezoelectric actuators installed across the torsion bars. Even if the abnormal vibration occurs due to the external vibration or impacts, a brakeage failure of the mirror by a collision of the mirror and the support (or a collision of the mirror and the movable frame, and a collision of the movable frame and the support) is avoided, and the abnormal vibration of the mirror (or the mirror and the movable frame) is weakened.

In the optical deflector of the seventh aspect, it is preferred that in one pair or two pairs of the piezoelectric actuators, the applied alternating current voltage to a piezoelectric actuator on one side of the torsion bar is different from the applied alternating current voltage to the piezoelectric actuator on the other side of the torsion bar by 180 degrees in phase (the eighth aspect).

In the optical deflector of the eighth aspect, sweeping of the light can be done by the efficient rotary oscillation of the mirror around a rotation axis along the torsion bar by having the reversed-phased bending deformations of the piezoelectric cantilevers of the piezoelectric actuators that are placed across the torsion bar from each other. Even if the abnormal vibration occurs due to the external vibration or impacts, a brakeage failure of the mirror by a collision of the mirror and the support (or a collision of the mirror and the movable frame, and a collision of the movable frame and the support) is avoided, and the abnormal vibration of the mirror (or the mirror and the movable frame) is weakened.

In the optical deflector of the first through eighth aspects, it is preferred that the mirror, the torsion bar, and the supporting body of piezoelectric cantilever are fabricated with the support integrally by patterning processes of the semiconductor substrate (the ninth aspect).

In the optical deflector of the ninth aspect, because of the fact that the mirror, the torsion bar, the support, and the supporting body of piezoelectric cantilever are fabricated integrally by the patterning process of the semiconductor substrate, no connecting part, glue or like element is necessary in contrast to cases where elements are made individually and the device is fabricated by jointing elements and gluing, etc. Therefore, the accuracy of the alignment is improved, and the device can be formed with relative ease with high precision. Because of the integral formation of the device, the whole optical deflector is connected mechanically, thereby no stress being concentrated on the connection parts as compared with cases where the individually formed parts are fabricated by jointing those parts. Thus, the mechanical strength of the optical deflector is improved. Furthermore, because the optical deflector is formed using a semiconductor substrate (e.g. a single crystal silicon substrate, or other silicon substrate such as an SOI substrate, etc.), the optical deflector can be formed integrally with ease by the process of patterning the semiconductor substrate using a semiconductor planer process and a MEMS process.

In the optical deflector of the present aspect which has a movable frame, it is preferred that the movable frame is also formed integrally by the patterning process together with the mirror, the torsion bar, the support, and the supporting body of the cantilever.

In the optical deflector of the ninth aspect, it is preferred that the piezoelectric material of the piezoelectric cantilever is formed by applying the patterning process to the single layer piezoelectric material film which is directly formed on the semiconductor substrate (the tenth aspect).

In the optical deflector of the tenth aspect, because the piezoelectric material of the piezoelectric cantilever is formed by applying a patterning process to the single layer piezoelectric material film which is directly formed on the semiconductor substrate, the optical deflector has a simple structure and is easily be formed by using the semiconductor planer process. Further, because the supporting body of piezoelectric cantilever and the piezoelectric material are formed integrally, no connecting part, glue or like element is necessary as compared with cases where constituent elements are made individually and the device is fabricated by jointing members and gluing. Thus, the accuracy of the alignment is improved, no stress is concentrated at the glued joints, and the mechanical strength of the piezoelectric actuator can be improved.

In the optical deflector in the tenth aspect, it is preferable that the reflecting plane of the mirror and the electrode of the piezoelectric cantilever are formed by the patterning process of the thin metal film which is directly deposited on the semiconductor substrate and on the piezoelectric material film (the eleventh aspect).

In the optical deflector of the eleventh aspect, because of the fact that the reflecting plane of the mirror and the electrode of the piezoelectric cantilever are formed by the patterning process of the thin metal film which is directly deposited on the semiconductor substrate and on the piezoelectric material film, the optical deflector has a simple structure and is easily be formed by the semiconductor planer process.

In another aspect of the present invention, there is provided an optical deflector including a mirror having a reflective plane; a torsion bar extending outwardly from a side of said mirror; a support surrounding said mirror; a piezoelectric cantilever including a supporting body and a piezoelectric body formed on the supporting body, one end of said piezoelectric cantilever being connected to said torsion bar, the other end of the piezoelectric cantilever being connected to said support, said piezoelectric cantilever, upon application of a driving voltage to the piezoelectric body, exhibiting a bending deformation due to piezoelectricity so as to rotate said torsion bar, thereby rotarily driving said mirror through said torsion bar; and an impact attenuator connected to said support, the impact attenuator being disposed in a gap between said mirror and said support.

In another aspect, the present invention provides an optical deflector including a mirror having a reflective plane; a pair of first torsion bars respectively extending outwardly from two opposing sides of said mirror, said pair of first torsion bars being substantially coaxial to each other to define a first rotational axis; a movable frame surrounding said mirror; a pair of first piezoelectric cantilevers disposed across said mirror from each other, each of the first piezoelectric cantilevers including a supporting body and a piezoelectric body formed on the supporting body, one end of the first piezoelectric cantilever being connected to said first torsion bar, the other end of the first piezoelectric cantilever being connected to said movable frame, said pair of first piezoelectric cantilevers, upon application of driving voltages to the respective piezoelectric bodies, exhibiting respective bending deformations due to piezoelectricity so as to rotate said pair of first torsion bars relative to the movable frame around the first rotational axis, thereby rotarily driving said mirror through said first torsion bars relative to the movable frame around the first rotational axis; a first impact attenuator connected to said movable frame, the impact attenuator being disposed in a gap between said mirror and said movable frame; a pair of second torsion bars respectively extending outwardly from two opposing sides of said movable frame, said pair of second torsion bars being substantially coaxial to each other to define a second rotational axis; a support surrounding said movable frame; a pair of second piezoelectric cantilevers disposed across said movable frame from each other, each of the second piezoelectric cantilevers including a supporting body and a piezoelectric body formed on the supporting body, one end of the second piezoelectric cantilever being connected to said second torsion bar, the other end of the second piezoelectric cantilever being connected to said support, said pair of second piezoelectric cantilevers, upon application of driving voltages to the respective piezoelectric bodies, exhibiting respective bending deformations due to piezoelectricity so as to rotate said pair of second torsion bars relative to the support around the second rotational axis, thereby rotarily driving said movable frame through said pair of second torsion bars relative to the support around the second rotational axis; and a second impact attenuator connected to said support, the second impact attenuator being disposed in a gap between said movable frame and said support.

According to various aspects of the present invention, because the optical deflector can be formed integrally with ease using a semiconductor planer process and a MEMS process, the manufacturing of the optical deflector is relatively easy and it is possible to mass-produce the optical deflector and to improve the yield. Furthermore, when this optical deflector needs to be installed in another device, because it is possible to form the optical deflector integrally with the entire device using a semiconductor planer process and a MEMS process, it is relatively easy to install the optical deflector in other devices, resulting in a reduced device size and efficient mass-production.

It is to be understood that both the foregoing general description and the following detailed description are exemplary and explanatory, and are intended to provide further explanation of the invention as claimed.

DESCRIPTION OF THE PREFERRED EMBODIMENTS

First Embodiment

Figure 1A:
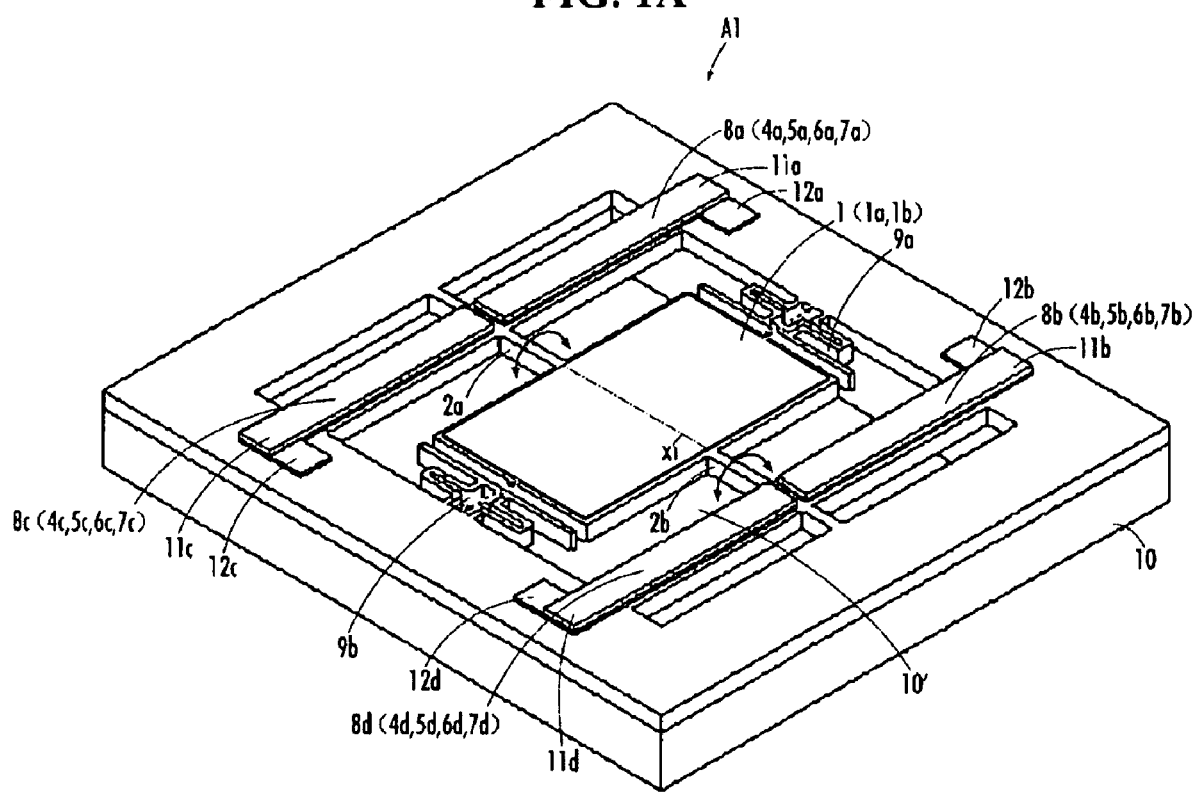
FIG. 1A is a perspective view of a configuration of an optical deflector according to a first embodiment.
Figure 1B:
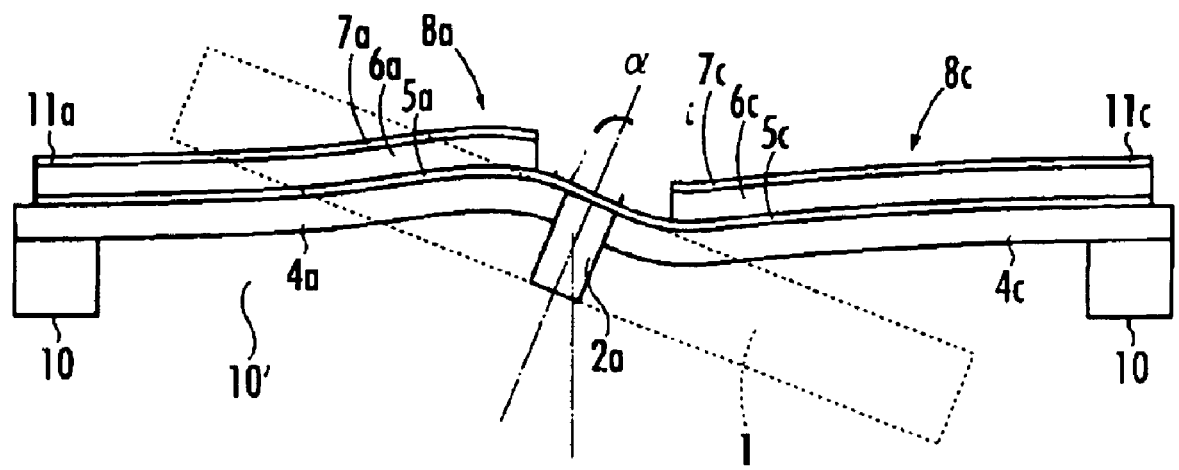
FIG. 1B is a schematic side view of a pair of piezoelectric actuators in the optical deflector of FIG. 1A.

With reference to FIGS. 1A to 2H, an optical deflector according to a first embodiment of the present invention is described. FIG. 1A is a perspective view of the optical deflector A1 according to the present embodiment. FIGS. 2A-2H 2 illustrate a manufacturing process of the optical deflector A1 of FIG. 1A.

As shown in FIG. 1A, the optical deflector A1 of the present embodiment includes a mirror 1 which reflects incoming light, torsion bars 2a, 2b which are connected to the mirror 1, piezoelectric actuators 8a-8d which rotarily drive the mirror 1 through the torsion bars 2a, 2b, a support 10 which supports the piezoelectric actuators 8a-8d, and impact attenuators 9a, 9b which are connected to the support 10.

The mirror 1 is rectangular in its shape, and a pair of torsion bars 2a, 2b extend outwardly from the center of respective sides of the mirror 1. The anchoring end of the torsion bar 2a is connected to the support 10 and the leading end is connected to the mirror 1. The torsion bar 2a is connected to the leading ends of a pair of the piezoelectric actuators 8a, 8c which are placed across the anchor end of the torsion bar.

The anchor end of the other torsion bar 2b is also connected to the support 10 and the leading end is connected to the mirror 1. The torsion bar 2b is connected to the leading ends of a pair of the piezoelectric actuators 8b, 8d which are placed across the anchor end of the torsion bar.

The respective anchor ends of the piezoelectric actuators 8a-8d are connected to and supported by the support 10. The support 10 is installed so as to surround the mirror 1, the torsion bar 2a, 2b, and the piezoelectric actuators 8a-8d. The piezoelectric actuators 8a-8d each includes one piezoelectric cantilever. The piezoelectric cantilevers have supporting body 4a-4d, bottom electrodes 5a-5d, and top electrode 7a-7d, respectively. See FIG. 1B.

On the support 10, the optical deflector A1 has top electrode pads 11a-11d (in the present embodiment, the top electrode pads 11a-11d are formed as extensions of the top electrode 7a-7d) and bottom electrode pads 12a-12d for applying a drive voltage between the top electrodes 7a-7d and the bottom electrodes 5a-5d of the piezoelectric actuator 8a-8d, respectively.

The bottom electrodes 12a-12d and the bottom electrodes 5a-5d are formed by patterning a thin metal film (in the present embodiment, this thin metal film is 2 layers of thin metal films; this thin metal film is also referred to as the "bottom electrode layer" hereafter) formed on the silicon substrate using the semiconductor planer process. For the materials of the double-layer thin metal film, titanium (Ti) is used in the first layer (the lower layer) and platinum (Pt) is used in the second layer (the upper layer), for example. Specifically, the bottom electrodes 5a-5d are formed on the almost entire surface of the supporting bodies 4a-4d, respectively. The bottom electrode pads 12a-12d, which are formed on the support 10, are electrically connected to the bottom electrodes 5a-5d through the bottom electrode layer on the support 10.

Piezoelectric bodies 6a-6d are formed on the bottom electrodes 5a-5d, respectively, so as to be separated from each other by patterning a layer of the piezoelectric material film (also referred to as the piezoelectric layer hereafter) formed on the bottom electrode layer using a semiconductor planer process. For the material of the piezoelectric layer, a piezoelectric material of lead zirconate titanate (PZT) can be used, for example. Specifically, the piezoelectric bodies 6a-6d are formed on the almost entire top surface of the supporting bodies 4a-4d.

The top electrode pad 11a-11d and top electrodes 7a-7d are formed by patterning a thin metal film formed on the piezoelectric layer (in the present embodiment, this thin metal film is a layer of a thin metal film; also referred to as the top electrode layer hereinafter) using a semiconductor planer process. For the material of the thin metal film, Pt, Au can be used, for example. Specifically, the top electrodes 7a-7d are formed on the almost entire top surface of the piezoelectric bodies 6a-6d, and the top electrode pads 11a-11d that are formed over the support 10 are electrically connected to the top electrodes 7a-7d.

The mirror 1 includes a mirror supporting body 1a and a reflecting film of the mirror plane (the reflecting plane) 1b which is formed on the mirror supporting body 1a. The reflecting film of the mirror plane 1b is formed by the patterning process of a thin metal film on the mirror supporting body 1a (in the present embodiment, the two layers of thin metal films which form the bottom electrode layer are used as this thin metal film as well) using a semiconductor planer process. For the material of the thin metal film, Au, Pt, Ag, and/or Al can be used, for example.

In this example, the mirror supporting body 1a, the torsion bars 2a, 2b, the supporting bodies 4a-4d of the piezoelectric cantilevers of the piezoelectric actuators 8a-8d, and the support 10 are integrally formed by patterning a silicon substrate into a desired shape. For the technology of the patterning process, semiconductor planer processes using a photolithography technique or dry etching technique and/or a MEMS process can be used, for example.

A gap 10' is provided between the mirror 1 and the support 10, which enables the mirror 1 to be driven rotarily up to a predetermined deflection angle. The mirror 1 is mechanically connected to the piezoelectric actuators 8a-8d and is driven rotarily in response to the operations of the piezoelectric actuators 8a-8d.

Furthermore, impact attenuators 9a, 9b are formed in the gap 10'. The impact attenuators 9a, 9b are connected to the support 10 so as to face respectively the two opposing sides of the mirror 1 that are perpendicular to the sides from which the torsion bars 2a, 2b extend outwardly. In this way, because the impact attenuators 9a, 9b are installed in the gap 10' between the mirror 1 and the support 10, the device size of the optical deflector A1 is not significantly increased by having the impact attenuators.

Here, the impact attenuators 9a, 9b are formed integrally and simultaneously with the support 10 by patterning the above-mentioned semiconductor substrate into a shape which exhibits proper spring characteristics. Because the impact attenuators 9a, 9b are formed integrally with the support 10 by the patterning process, no connecting part or glue, etc., is necessary in contrast to the case where elements are made individually and the device is formed by cementing and gluing, etc. Furthermore, the alignment accuracy is improved, and the device can be formed with high precision with ease. Because the support 10 and the impact attenuators 9a, 9b are connected mechanically in the integral formation of the device, no stress is concentrated on the connection part in contrast to the case where the individually formed parts are fabricated by jointing those parts. Therefore, the durability of the impact attenuators 9a, 9b is improved.

Furthermore, the optical deflector A1 is connected to a control circuit (not shown in the figure). The control circuit controls the phase, frequency, and the deflection angle of the deflection and sweeping/scanning motions of the mirror 1 by controlling the phase, frequency, amplitude, and the wave shape, etc., of the driving voltage of the piezoelectric actuators 8a-8d.

In the following, the operations of the optical deflector A1 of the present embodiment will be explained. First, in the normal operation mode, a driving voltage is applied to two pairs of the piezoelectric actuators 8a-8d in the optical deflector A1 to drive the piezoelectric actuators 8a-8d so as to cause rotational oscillation of the mirror 1.

In more detail, by applying the reverse polarity voltages ±V1 with respect to one another between the two pairs of the top electrodes 7a, 7c and the bottom electrodes 5a, 5c of the piezoelectric actuators 7a, 7c, respectively, the two piezoelectric actuators 7a, 7c exhibit a bending deformation in opposite directions with respect to one another. Due to this bending motion, because the anchor ends of the piezoelectric actuators 8a, 8c are connected to and supported by the support 10, the leading ends of the piezoelectric actuators 8a, 8c are driven rotarily upward and downward, respectively, along the thickness direction of the support 10 (substrate). Because the reverse polarity voltages ±V1 are applied to the piezoelectric actuators 8a, 8c, respectively, the leading ends of one piezoelectric actuator 8a moves in a direction opposite to the direction in which the leading end of the other piezoelectric actuator 8c moves. Therefore, a torsional displacement is generated in the torsion bar 2a, and a rotary torque centered at the torsion bar 2a is generated and acts on the mirror 1.

Likewise, by applying the reverse polarity voltages ±V1 with respect to one another to the other pair of the piezoelectric actuators 8b, 8d, the torsion displacement is generated in the torsion bar 2b in the same direction as in the above-mentioned case, and the rotary torque centered at the torsion bar 2b acts on the mirror 1.

Therefore, by appropriately driving the piezoelectric actuators 8a-8d, a rotary torque a centered at the torsion bars 2a, 2b is generated and acts on the mirror 1. As a result, as shown by the arrows in FIG. 1A, the mirror 1 rotates about the torsion bars 2a, 2b as the rotational center axis.

In addition, for each of the above-described pairs of the actuators, a first alternating current voltage is applied to the piezoelectric actuators 8a, 8b on one side of the pairs with the same phase with respect to each other. And a second alternating current voltage is applied to the piezoelectric actuators 8c, 8d on the other side of the pairs with the same phase with respect to each other. Here, the first alternating current voltage and the second alternating current voltage are alternating current voltages (a sine wave, for example) with reverse phases with respect to one another or with a phase offset with respect to one another. By driving the mirror 1 rotarily in this manner, it is possible to deflect and sweep a light beam in one direction with a predetermined frequency with a predetermined deflection angle. Here, the light sweeping/scanning operation with an even larger deflection angle can be realized through a resonant drive of the mirror 1 by applying a driving voltage to the piezoelectric actuators 8a-8d at a frequency near the mechanical resonant frequency (the first resonant point) of the mirror 1 including the torsion bars 2a, 2b. However, depending on the need, the drive of the piezoelectric actuators 8a-8d can be a non-resonant drive, and the applied voltage can be a direct current voltage.

In these normal operation modes, the mirror 1 rotates without touching the impact attenuators 9a, 9b. Because the impact attenuators 9a, 9b are connected to the support 10, the normal rotation of the mirror 1 is not interfered.

On the other hand, in abnormal conditions, such as when the mirror 1 abnormally oscillates in response to unexpected external impacts or vibrations, in addition to the controlled rotation around a rotation axis along the torsion bars 2a, 2b, undesirable translational motions in the device plane in the direction perpendicular to the torsion bars 2a, 2b may be generated (shown by dashed arrows in FIG. 1A). Even if such translational motion is generated, because the impact attenuators 9a, 9b are installed, a direct collision of the mirror 1 to the support 10 is avoided. Because the impact attenuators are formed to a shape that has appropriate spring characteristics, the impact is attenuated by the contact of the mirror 1 with the impact attenuators 9a, 9b.

Therefore, according to the optical deflector A1 of the present embodiment, by having the impact attenuators 9a, 9b, it is possible to weaken or dump the vibrations and impacts, thereby effectively avoiding breakage failure without increasing the device size or sacrificing the deflection/sweeping performance.

Manufacturing Process

FIGS. 2A-2H illustrate a manufacturing process of the optical deflector A1. Here, FIGS. 2A-2H schematically show cross sections of the optical deflector A1 in various manufacturing steps.

Figure 2A:
FIGS. 2A to 2H illustrate manufacturing steps for the optical deflector shown in FIG. 1A.

As shown in FIG. 2A, an SOI substrate 31 is used as the semiconductor substrate that forms the mirror support 1a; the torsion bars 2a, 2b; the supporting bodies 4a-4d of the piezoelectric cantilevers of the piezoelectric actuators 8a-8d; the support 10; and the impact attenuators 9a, 9b. The SOI substrate 31 is a laminated substrate in which a single crystal silicon (referred to as "active layer 31a" or "SOI layer"), silicon oxide (interlayer oxide film 31b), and single crystal silicon (handling layer 31c) are laminated together. The thickness of each layer of the SOI substrate is, for example, as follows: the active layer 31a: 5-100 µm; the interlayer oxide film 31b: 0.5-2 µm; and the handling layer 31c: 100-600 µm. The top surface of the active layer 31a is treated with an optical polishing process.

Figure 2B:
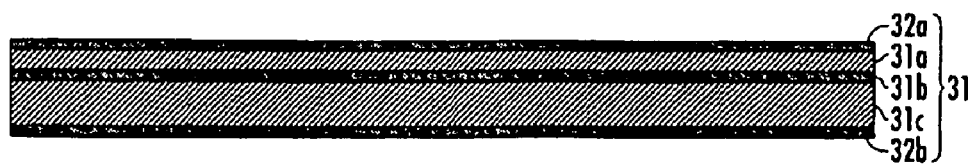

As shown in FIG. 2B, thermal oxidation films 32a, 32b are formed by oxidizing the top surface (the side of the active layer 31a) and the bottom surface (the side of the handling layer 31c) in a thermal oxidation furnace (a diffusion furnace). This step is referred to as the thermal oxidation step. The thickness of the thermal oxide films 32a, 32b is 0.1-1 µm, for example.

Figure 2C:
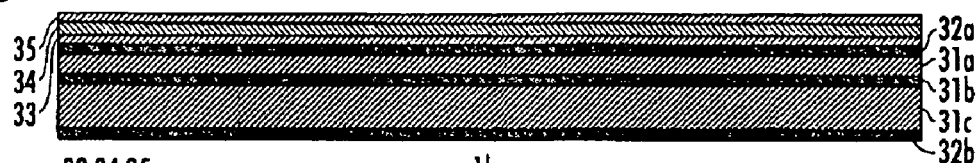

Next, as shown in FIG. 2C, bottom electrode layer 33, piezoelectric layer 34, and top electrode layer 35 are formed in series over the top surface of the SOI substrate 31 (the side of the active layer 31a).

In the formation of the bottom electrode layer, the bottom electrode layer 33 made of two layers of thin metal films is formed on the top surface of the thermal oxide film 32a on the side of the active layer 31a of the SOI substrate 31. For the material of the bottom electrode layer 33, titanium is used for the first thin metal film layer (the lower layer) and platinum is used for the second thin metal film layer (the upper layer). Each thin metal film is formed using a sputtering technique or a electron beam evaporation technique, etc. The thickness of those thin metal films are for example, about 30-100 µm for the first Ti layer and about 100-300 µm for the second Pt layer.

Next, in the forming step of the piezoelectric layer, a piezoelectric layer 34 which is made of one layer of a piezoelectric film is formed on the bottom electrode layer 33. For the material of the piezoelectric layer 34, a piezoelectric material of lead zirconate titanate (PZT) may be used, for example. The thickness of the piezoelectric film is about 1-10 µm for example. The piezoelectric material film is formed, for example, by an ion plating technique using the reactive arc discharge. More specifically, as the ion plating technique using the reactive arc discharge, a technique described in the Patent Application Documents by the present applicants: Laid-open 2001-234331, Laid-open 2002-177765, and Laid-open 2003-81694 may be used. These Japanese publications are hereby incorporated by reference in their entireties.

In an ion plating technique using the reactive arc plasma, a metal material is thermally evaporated in a high density oxygen plasma which is generated by a plasma gun in a vacuum chamber so that the metal vapor reacts with the oxygen in the vacuum chamber or on a semiconductor substrate to form a piezoelectric film on the semiconductor substrate. Using this technique, a piezoelectric film can be formed at a high rate even at a relatively low film forming temperature. Also, a high quality piezoelectric film with superior piezoelectric properties can be obtained by using a seed layer formed by the CSD (chemical solution deposition) technique as a base layer prior to the formation of the piezoelectric layer by the ion plating technique using the reactive arc discharge.

Alternatively, the piezoelectric film can also be formed by sputtering, a sol-gel technique, etc. However, in general, a thicker piezoelectric film with better piezoelectric properties (as good as the piezoelectric property of a bulk piezoelectric material) can be formed using the ion plating technique using the reactive arc discharge.

Next, in the forming step of the top electrode layer, the top electrode layer 35 made of a metal thin film is formed on the piezoelectric layer 34. For the material of the top electrode layer 35, Pt or Au may be used. The top electrode layer 35 is formed by sputtering, electron beam evaporation technique, etc. The thickness of the top electrode layer 35 is, for example, about 10-200 nm.

Figure 2D:
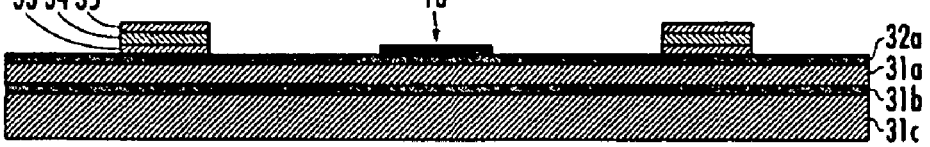

Next, as shown in FIG. 2D, by patterning the top electrode layer 35, the piezoelectric layer 34, and the bottom electrode layer 33, the top electrodes 7a-7d, the piezoelectric bodies 6a-6d, and the bottom electrodes 5a-5d of the piezoelectric actuators 8a-8d are formed.

More specifically, a resist is disposed on the top electrode layer 35 and is patterned by photolithography. Next, using the patterned resist as a mask, the top electrode layer 35 and the piezoelectric layer 34 are dry-etched by an RIE (Reactive Ion Etching) device. In this process, the top electrode pads 11a-11d, the top electrodes 7a-7d, and the piezoelectric bodies 6a-6d are formed.

Then, another resist is disposed on the bottom electrode layer 33 and is patterned by photolithography. Next, using the patterned resist as a mask, the bottom electrode layer 33 is dry-etched by an RIE device. In this process, the bottom electrode pads 12a-12d and the bottom electrodes 5a-5d are formed.

In this step, as shown in FIG. 2D, a mirror plane reflective film 1b of the mirror 1 is simultaneously formed by leaving the bottom electrode layer in an area that corresponds to the mirror 1 by protecting that area against the dry etch using the appropriately patterned resist as a mask.

Alternatively, the reflective plane 1b may be formed by a separate process in order to possibly improve its reflection properties. In this case, first, a layer of thin metal film (the reflective film) is formed on the entire surface of the SOI substrate 31 on the side of the active layer 31a. For the material of the reflective film, Au, Pt, Al, etc., may be used, for example. The reflective film can be formed by sputtering or an evaporation technique, for example. The thickness of the reflective film may be about 100-500 µm, for example.

Next, the reflective film is patterned into a desired shape. Specifically, first, a resist is disposed on the reflective film and is patterned by photolithography. Next, using the patterned resist as a mask, the reflective film is dry-etched by an RIE device. By this process, the reflective film 1b of the mirror 1 is formed on the thermally oxidized silicon film 32a on the side of the active layer 31a of the SOI substrate 31.

Next, as shown in FIGS. 2E-2H, in the step of forming the support (the forming step of the impact attenuators as well), the mirror support 1a, the torsion bars 2a, 2b, the supporting bodies 4a-4d of the piezoelectric cantilevers of the piezoelectric actuators 8a-8d, the support 10, and the impact attenuators 9a, 9b are formed.

Figure 2E:
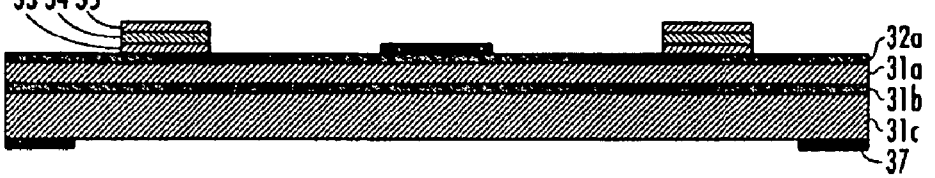

First, as shown in FIG. 2E, a hard mask is formed after removing the thermal oxide film 32b. Specifically, the thermally oxidized silicon film 32b on the bottom side of the handling layer 31c of the SOI substrate is removed by buffered hydrofluoric acid (BHF) after protecting the entire top surface of the SOI substrate with a thick resist. Thereafter, a layer of thin Al film 37 is formed on the entire bottom surface of the handling layer 31c. The thin Al film is formed by sputtering or a vaporization technique, for example. Then, a resist is formed on the thin Al film and is patterned by photolithography. The thin Al film 37 is then wet-etched using the patterned resist material as a mask. This way, a hard mask 37 is formed. The hard mask 37 is used in a later dry etching process using an ICP (inductively Coupled Plasma)-RIE apparatus, which step is shown in FIG. 2G.

Figure 2F:
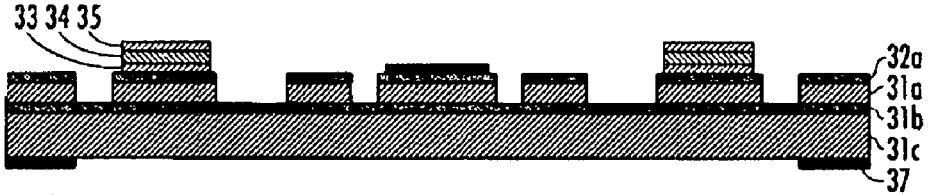

Next, as shown in FIG. 2F, the active layer 31a (the single crystal silicon) is patterned. First, a resist is formed on the entire surface and patterned by photolithography. Then, the thermal oxide film 32a and the active layer 31a are patterned by an ICP-RIE apparatus using the patterned resist as a mask. The ICP-RIE apparatus is a dry etching apparatus which is used in micro machining and which makes it possible to scrape out the silicon vertically and deeply.

Figure 2G:

Next, as shown in FIG. 2G, the handling layer 31c is patterned. The silicon of the handling layer 31c is processed using the hard mask, which was made in the process in FIG. 2E, by using the ICP-RIE device. In this process, the silicon is scraped out deeply on the back sides of the torsion bar 2a, 2b, the supporting bodies 4a-4h, and the impact attenuators 9a, 9b. As a result, these structures no longer have thick back support.

Figure 2H:
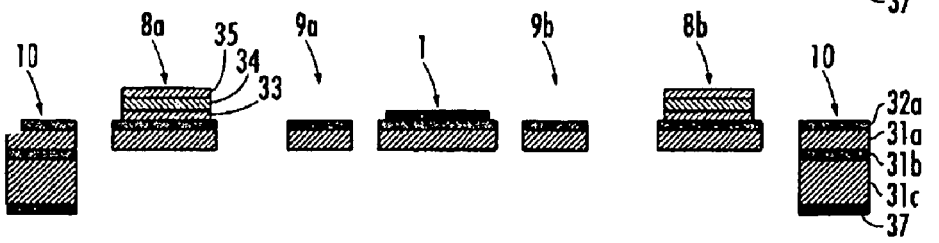

Next, as shown in FIG. 2H, the interlayer oxide film 31b of the SOI substrate 31 is removed by wet etching with buffered hydrofluoric acid (BHF). In this process, a gap 10' is formed so that the mirror 1 and the torsion bars 2a, 2b, the piezoelectric actuator 8a-8d and the impact attenuators 9a, 9b are movable and operable.

In the above-described process, a plurality of optical deflectors A1 can be manufactured on the same substrate. Upon the completion of the manufacturing process, each deflector is separated as an individual chip by a dicing process. Each device chip is then mounted in a TO (Transistor Outline) type CAN package by the die bonding and the wire bonding, for example.

As shown above, because the optical deflector A1 can be formed integrally using a semiconductor planer process and a MEMS process, the manufacturing of the optical deflector is relatively easy, and it is possible to reduce the device size and efficiently mass-produce the optical deflector, resulting in the improved yield. In addition, because the impact attenuators 9a-9b are formed in a step which forms other constituents of the optical deflector A1, the number of fabrication steps is not increased, and essentially, no additional complexity in the manufacturing steps is introduced for the formation of the impact attenuators. Furthermore, when the optical deflector A1 of this embodiment needs to be installed in a device, it is possible to form the optical deflector integrally within that device by forming a whole device integrally using a semiconductor planer process and a MEMS process. Thus, it is relatively easy to install the optical deflector A1 of the present embodiment in other devices.

The optical deflector A1 of the present embodiment has been actually manufactured and tested. In this working example, the optical deflector A1 was designed to have a resonant frequency at 5 kHz, and was manufactured in the aforementioned manufacturing process. In this case, the thickness of each layer of the SOI substrate was: the active layer: 30 μm; the interlayer oxide film layer: 2 μm; the handling layer: 525 μm, and the thermal oxide film: 500 nm, respectively. The thickness of the bottom electrode (Ti/Pt) layers was: 50 μm for the Ti layer and 150 nm for the Pt layer. The thicknesses of the piezoelectric layer and the top electrode layer were 3 μm and 150 nm, respectively.

In the optical deflector, the maximum deflection angle of ±10° was obtained by applying the alternating current voltage (a sine wave) parameterized by a peak-to-peak voltage $V_{pp}$ of 20 V and a frequency of 5 kHz. Here, the rotation angle of the mirror 1 was measured by transmitting a He—Ne laser beam onto the mirror 1 and by observing the reflected light on a screen which was placed at a predetermined distance.

External impacts at an acceleration of 1,500 G were applied to the optical deflector. Here, the testing procedures of JIS C60068-2-27 Environmental Testing Procedure-Electrical-Electronics—Impact Testing Procedure (Pendulum Impact Tester), and JIS C60068-2-32 Environmental Testing Procedure-Electrical-Electronics—Free fall testing Procedure (Free Fall Tester), were used. The test results indicated that there was no breakage failure, and the optical deflector under the tests maintained its mechanical properties (the deflection/sweeping characteristics).

Also, an external vibration at an acceleration of 500 G was applied to the optical deflector. Here, the testing procedures of JIS C60068-2-6 27 Environmental Testing Procedure-Electrical-Electronics—Sine Wave Vibration Testing procedure was used. The test result indicated that there was no breakage failure, and the optical deflector under the test maintained its mechanical properties (the deflection/sweeping characteristics).

As Comparison Example 1, an optical deflector was manufactured in the same manner as the working example discussed above, except that the impact attenuators 9A, 9b were not equipped in Comparison Example 1. When the same impacts as for the working example at an acceleration of 1,500 G were applied to the optical deflector of Comparison Example 1, the torsion bars 2a, 2b broke. Also, when the oscillation at an acceleration of 500 G was applied to the optical deflector of Comparison Example 1, the torsion bars 2a, 2b were cracked, and the mechanical characteristics of the optical deflector were significantly deteriorated.

Second Embodiment

Figure 3:
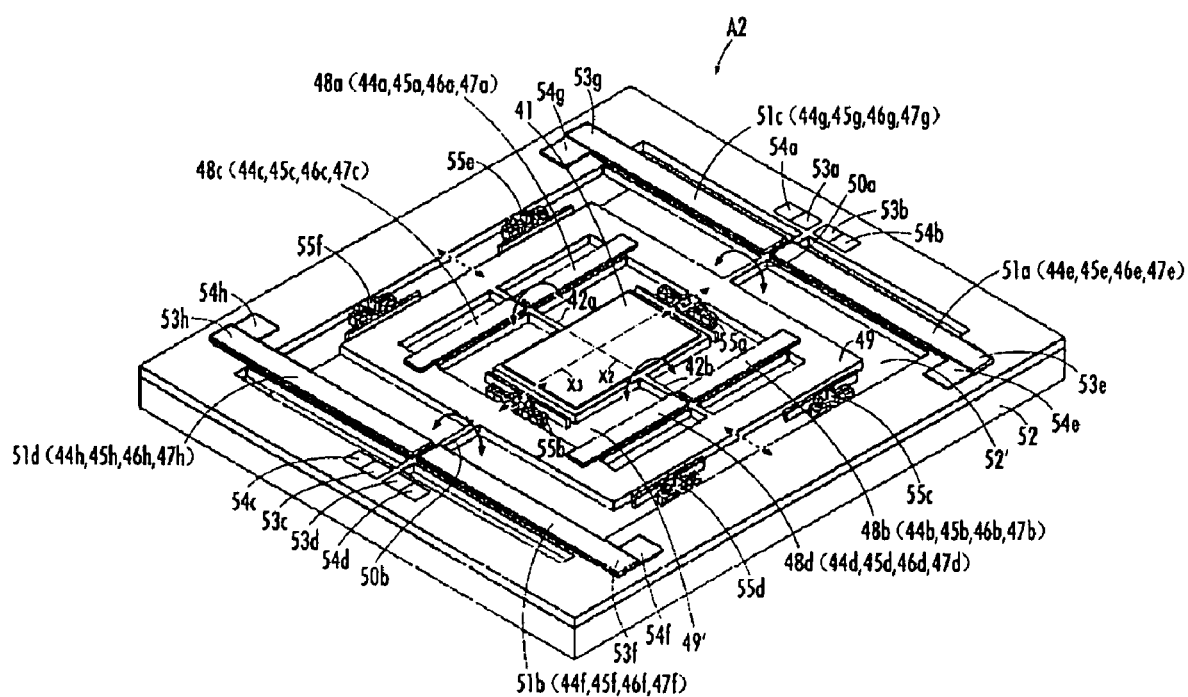
FIG. 3 is a perspective view of a configuration of an optical deflector according to a second embodiment.

A second embodiment of the present invention is described with reference to FIG. 3. FIG. 3 is a perspective view showing a configuration of optical deflector A2 of the second embodiment of the present invention. The optical deflector A2 of the present embodiment is equipped with additional two pairs of piezoelectric actuators in order to rotarily drive, as a unit, the mirror, the torsion bars, and two pairs of the piezoelectric actuators of the first embodiment.

The optical deflector A2 of the present embodiment includes a mirror 41 which reflects incident light, first torsion bars 42a, 42b connected to the mirror 41, two pairs of inner first piezoelectric actuators 48a-48d, movable frame 49 supporting the first piezoelectric actuators 48a-48d, second torsion bars 50a, 50b connected to the movable frame 49, two pairs of outer second piezoelectric actuators 51a-51d, and support 52 which supports the second piezoelectric actuators 51a-51d.

The mirror 41 is rectangular in its shape, and a pair of the torsion bars 42a, 42b extend outwardly from the respective center positions of the opposing sides of the rectangular shape. The anchor end of the first torsion bar 42a on one side is connected to the inner side of the movable frame 49 and the leading end is connected to the mirror 1. The first torsion bar 42*a* is connected to the respective leading ends of a pair of the piezoelectric actuators 48*a*, 48*c*, which are placed across the anchor end of the torsion bar 42*a* from each other.

The anchor end of the other first torsion bar 42*b* on the other side is also connected to the inner side of the movable frame 49 and the leading end is connected to the mirror 1. The first torsion bar 42*b* is connected to the respective leading ends of a pair of the piezoelectric actuators 48*b*, 48*d*, which are placed across the anchor end of the torsion bar 42*b* from each other.

The movable frame 49 is rectangular in its shape, and a pair of the second torsion bars 50*a*, 50*b* extend outwardly from the respective center positions of the opposing two sides of the rectangular frame 49 that are perpendicular to other two sides of the mirror from which the first torsion bars 42*a*, 42*b* extend outwardly. The anchor end of the second torsion bar 50*a* at one side is connected to the support 52, and the leading end is connected to the outer side of the movable frame 49. The second torsion bar 50*a* is connected to the respective leading ends of a pair of the second piezoelectric actuators 51*a*, 51*c*, which are placed across the anchor end of the torsion bar 50*a* from each other.

The anchor end of the second torsion bar 50*b* on the other side is connected to the support 52, and the leading end is connected to the outer side of the movable frame 49. The second torsion bar 50*b* is connected to the respective leading ends of a pair of the second piezoelectric actuators 51*b*, 51*c*, which are placed across the anchor end of the torsion bar 50*b* from each other.

The movable frame 49 is installed such that the movable frame 49 surrounds the mirror 41, the first torsion bars 42*a*, 42*b*, and the first actuators 48*a*-48*d*. The anchor ends of the first actuators 48*a*-48*d* are connected to and supported by the inner side of the movable frame 49. The support 51 is installed such that the support surrounds the movable frame 49 and the second piezoelectric actuators 51*a*-51*d*. The anchor ends of the second piezoelectric actuators 51*a*-51*d* are connected to and supported by the support 52.

Each of the first and the second piezoelectric actuators 48*a*-48*d*, 51*a*-51*d* are formed of one piezoelectric cantilever. The respective piezoelectric cantilevers have supporting bodies 44*a*-44*h*, bottom electrodes 45*a*-45*h*, piezoelectric bodies 46*a*-46*h*, and upper electrodes 47*a*-47*h*.

Furthermore, on the support 53, the optical deflector A2 has top electrode pads 53*a*-53*d* and the bottom electrode pads 54*a*-54*d* for applying the driving voltage between the top electrodes 47*a*-47*d* and the bottom electrodes 45*a*-45*d* of the first piezoelectric actuators 48*a*-48*d*, respectively. Also, on the support 53, the optical deflector A2 has the top electrode pads 53*a*-53*d* and the bottom electrode pads 54*e*-54*h* for applying the driving voltage between the top electrodes 47*e*-47*h* and the bottom electrodes 45*e*-45*h* of the first piezoelectric actuators 51*a*-51*d* on the support 53, respectively. In this embodiment, the top electrode pads 53*a*-53*d* are formed as extensions of the top electrodes 47*e*-47*h*.

The mirror supporting body 41*a*, the first and the second torsion bars 42*a*, 42*b*, 50*a*, 50*b*, the supporting bodies 44*a*-44*h* of the first and second piezoelectric actuators 48*a*-48*d*, 51*a*-51*d*, the movable frame 49, and the support 52 are formed integrally by using the patterning processes. The techniques for the patterning process to process the semiconductor are the same as those which are used in the embodiments described above. Because of a gap 49' between the mirror 41 and the movable frame 49, the mirror 41 can rotate up to a certain angle. And because of a gap 52' between the movable frame 49 and the support 52, the movable frame 49 can rotate up to a certain angle.

Further, first impact attenuators 55*a*, 55*b* are installed in the gap 49' so as to be connected to the movable frame 49, respectively, and to face the two opposing sides of the mirror 41, respectively, which sides are perpendicular to the other two opposing sides from which the first torsion bars 42*a*, 42*b* extend outwardly. Moreover, second impact attenuators 55*c*-55*f* are installed in the gap 52' so as to be connected to the support 52, respectively, and to face the two opposing sides of the movable frame 49, respectively, which sides are perpendicular to the other two opposing sides from which the second torsion bars 50*a*, 50*b* extend outwardly. Here, the first and the second impact attenuators 55*a*-55*f* are shaped to have proper spring characteristics and are formed integrally with the movable frame 49 and the support 52 in the patterning process of the semiconductor substrate.

Furthermore, the optical deflector A2 is connected to a control circuit which controls the deflection and sweeping of the mirror 41. The control circuit controls the phase, frequency, and the deflection angle of the deflection/sweeping motion of mirror 41 by controlling the phase, frequency, amplitude, and the wave shape, etc. of the driving voltage of the first and the second piezoelectric actuators 48*a*-48*d*, 51*a*-51*d*.

In this embodiment, the structure of the mirror 41 may be the same as, or similar to, that of the mirror 1 in the first embodiment above. Further, the structures of the supporting bodies 44*a*-44*h*, the bottom electrodes 45*a*-45*h*, the piezoelectric bodies 46*a*-46*h*, and the top electrodes 47*a*-47*f* of the first and the second piezoelectric actuators 48*a*-48*d*, 51*a*-51*d* may be the same as, or similar to, those of the supporting bodies 4*a*-4*d*, the bottom electrodes 5*a*-5*d*, the piezoelectric bodies 6*a*-6*d*, the top electrodes 7*a*-7*d* of the first embodiment, respectively. Also, the structures of the first and the second impact attenuators 55*a*-55*f* may be the same as, or similar to those of the impact attenuators 9*a*, 9*b* in the first embodiment.

Next, operations of the optical deflector A2 of the present embodiment are explained. First, in the normal operation condition in which the mirror 41 is oscillated by diving the first and the second piezoelectric actuators 48*a*-48*d*, 51*a*-51*d*, a driving voltage is first applied to the two pairs of the inner first piezoelectric actuators 48*a*-48*d* in a manner similar to that in the first embodiment. This way, the first piezoelectric actuators 48*a*-48*d* are driven to generate angular displacements in their respective leading ends. Due to these angular displacements, the mirror 41 rotates around the first axis x2, which is the same axis as the axis of the pair of the first torsion bars 42*a*, 42*b*, in the directions shown by the arrows in FIG. 3.

At the same time, a driving voltage is applied to the two pairs of the outer second piezoelectric actuators 51*a*-51*d*. Accordingly, the second piezoelectric actuators 51*a*-51*d* are driven to generate angular displacements in their respective leading ends. Due to these angular displacements, the movable frame 49 rotates around the second axis x3, which is the same axis as the axis of the pair of the second torsion bars 50*a*, 50*b*, in the directions shown by the arrows in FIG. 3.

In this operation, because the first piezoelectric actuators 48*a*-48*d*, which drive the mirror 41, and the second piezoelectric actuators 51*a*-51*d*, which drive the movable frame 49, can be controlled independently, the mirror 41 and the movable frame 49 can rotate independently without interfering with each other's motion. For example, by rotating the movable frame 49, the mirror 41 and the first piezoelectric actuators 48*a*-48*d* rotate together as a unit. Therefore, the mirror 41 can rotate in a certain direction without driving the first piezoelectric actuators 48a-48d. Therefore, by driving the first and second piezoelectric actuators, the mirror 41 is driven around two axes to deflect an incoming light beam, such as a laser beam, to desired directions. In this normal operation, the mirror 41 rotates without touching the first and second impact attenuators 55a-55f.

On the other hand, in abnormal operation conditions, such as when the mirror 41 and/or the movable frame 49 abnormally oscillate in response to unexpected external impacts and vibrations, in addition to the controlled rotation around the first axis along the first torsion bars 42a, 42b, and the controlled rotation around the second axis along the second torsion bars 50a, 50b, undesirable translational motions in the device plane of the mirror 41 may occur. The mirror 41 may suffer such a translation motion in a direction perpendicular to the first torsion bars 42a, 42b (as shown by dashed arrows in FIG. 3). The movable frame 49 may undergo a translational motion in a direction perpendicular to the second torsion bars 50a, 50b (as shown by dashed arrows in FIG. 3). Even if these translational motions occur, because the impact attenuators 55a, 55b are installed in the gap 49' between the mirror 41 and the movable frame 49, a direct collision of the mirror 41 with the movable frame 49 is avoided and the abnormal vibration of the mirror 41 is alleviated. Also, because the impact attenuators 55c-55f are installed in the gap 52' between the movable frame 49 and the support 52, a direct collision of the movable frame 49 to the support 52 is avoided and the abnormal vibration of the movable frame 49 is alleviated.

Therefore, in the optical deflector of the present embodiment, in a similar manner to that in the first embodiment, by having the first and the second impact attenuators 55a-55f, it is possible to attenuate or dump abnormal vibrations and impacts and to avoid breakage failure without increasing the device size or sacrificing the device performance.

The optical deflector of the present embodiment can be manufactured by a method similar to the manufacturing processes described above for the first embodiment.

The optical deflector A2 of the present embodiment has been actually manufactured and tested. The aforementioned optical deflector A2 was designed to have a resonant frequency of the mirror 41 of 16 kHz or greater and the resonant frequency of the movable frame 49 of 60 Hz, and was manufactured by a manufacturing process similar to that used in the first embodiment.

In the same way as the tests performed on the first embodiment, external impacts were applied to the optical deflector of this working example. The test result indicated that there was no breakage failure, and the optical deflector maintained its mechanical properties (the deflection/sweeping characteristics).

COMPARISON EXAMPLE 2

As Comparison Example 2, the optical deflector was manufactured with the same constituents as in the second embodiment except that the impact attenuators were not equipped in Comparison Example 2. Even when the impacts at an acceleration of 100 G or less were applied to the optical deflector of Comparison Example 2 in the similar way as in the second embodiment, the second torsion bars broke.

Third Embodiment

Figure 4:
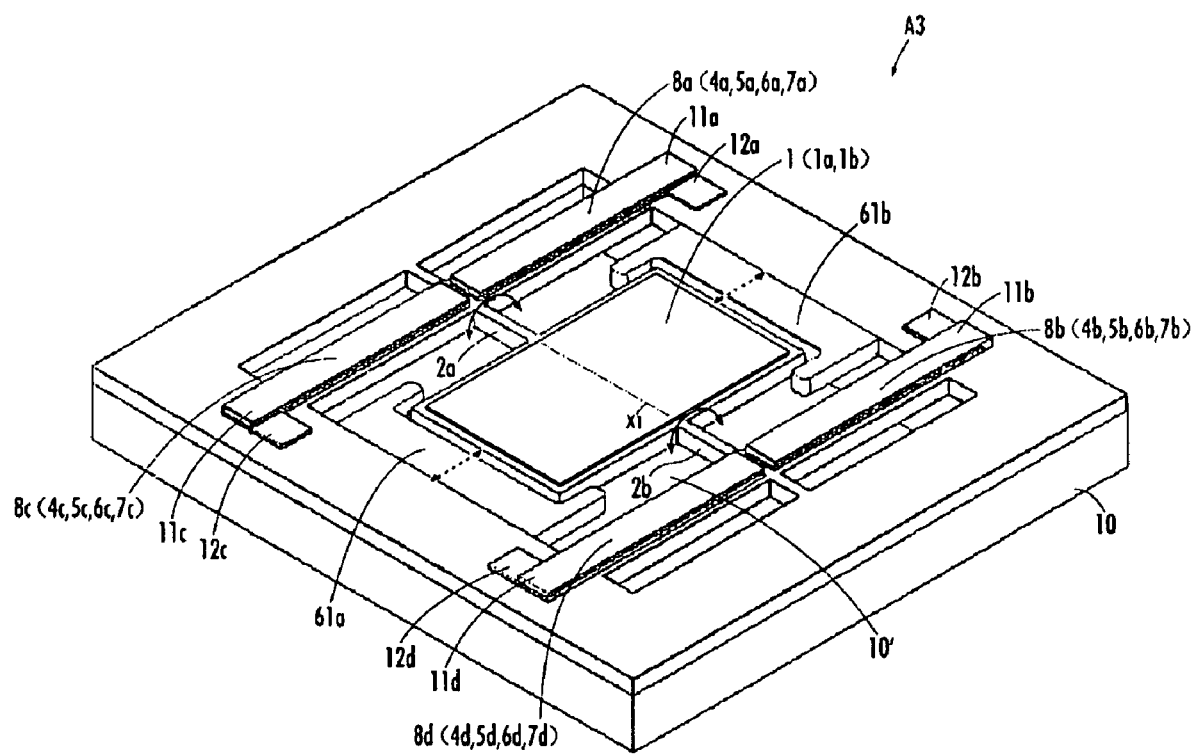
FIG. 4 is a perspective view of a configuration of an optical deflector according to a third embodiment.

A third embodiment of the present invention is explained with reference to FIG. 4. FIG. 4 is a perspective view which shows a configuration of optical deflector A3 according to the third embodiment. The optical deflector A3 of the present embodiment is similar to the first embodiment except that the impact attenuators are different from those provided in the first embodiment. The same reference numerals are used to indicate the same or like elements as in the first embodiment, and explanations of the same or like elements that have been explained above are not repeated below.

As in the case of the impact attenuators 9a, 9b of the first embodiment, as shown in FIG. 4, impact attenuators 61a, 61b of the present embodiment are installed in a gap 10' so as to be connected to the support 10 and to face the two opposing sides of the mirror 1 that are perpendicular to the other two opposing sides of the mirror 1 form which the torsion bars 2a, 2b extend outwardly. However, in this embodiment, the impact attenuators 61a, 61b are formed by patterning a photosensitive elastic polymer material by photolithography. For this polymer material, resist materials, such as epoxy resin resists and polyimide resin resists, may be used.

In manufacturing the optical deflector A3 of the present embodiment, as shown in FIG. 2E, after forming the desired shape of the silicon in the active layer 31a by a dry etching technique (as shown in FIG. 2F), a resist material, which is the material of the impact attenuator 61a, 61b, is coated and is patterned by exposure/development processes to form parts that corresponds to the impact attenuators 61a, 61b. Thereafter, the parts are cured at a suitable temperature to complete the manufacture of the impact attenuator 61, 61b. Following this process, the etching process on the side of the base wafer as shown in FIG. 2G is executed. The other processes are similar to those in the first embodiment. As described above, the impact attenuator 61a, 61b can be formed by inserting appropriate manufacturing steps in the manufacturing process of the optical deflector A3 that uses a semiconductor planer process and a micro machine technology.

As in the case of the first embodiment described above, in the normal operation condition in which the mirror 1 is rotated by driving the piezoelectric actuators 8a-8d, the mirror 1 rotates around the axis along the torsion bars 2a, 2b without touching the impact attenuators 61a, 61b. However, in abnormal conditions, such as when the mirror 1 abnormally vibrates in response to external impacts and vibrations, undesirable translational displacements of the mirror 1 may occur. Even if such translational motion of the mirror 1 (shown by broken arrows in FIG. 4) occurs in addition to the rotation around the axis along the torsion bars 2a, 2b, the mirror 1 first touches the impact attenuators, 61a, 61b, and there is no chance that the mirror 1 touches the support 10 directly. Because the impact is weakened by the impact attenuators 61a, 61b, the breakage failure of the mirror 1, torsion bars 2a, 2b, and the impact attenuators 61a, 61b can be avoided.

Therefore, in the optical deflector A3 of the present embodiment, by having impact attenuators 61a, 61b, it is possible to weaken the vibrations and impacts and to avoid breakage failure without increasing the device size or sacrificing the device performance.

The optical deflector of the present embodiment has been actually manufactured and tested. An optical deflector similar to the first embodiment except for the impact attenuators 61a, 61b was manufactured. For the material of the impact attenuators 61a, 61b, a thick epoxy group resin SU-8 (manufactured by the Kayaku MicroChem Co., Ltd.) was used. The curing temperature was at 250° C. When the driving voltage was applied to this working example of the optical deflector in the same way as in the first embodiment, the maximum deflection angle of ±10° was obtained.

In the same way as in the first embodiment, external impacts and vibrations were applied to the optical deflector.

The test results showed that there was no breakage failure even when the impact at an acceleration of 1,200 G was applied, and the device generally maintained its mechanical performance (deflection/sweeping characteristics). Even when the external vibration at an acceleration of 300 G was applied, the device generally maintained its mechanical performance (deflection/sweeping characteristics). However, when an external vibration at an acceleration of 1,200 G or greater was applied, and when an external vibration at an acceleration of 300 G was applied, there were incidents where a sticktion of the mirror 1 with the impact attenuator 61a, 61b occurred, and the operation of the optical deflector failed.

Fourth Embodiment

Figure 5:
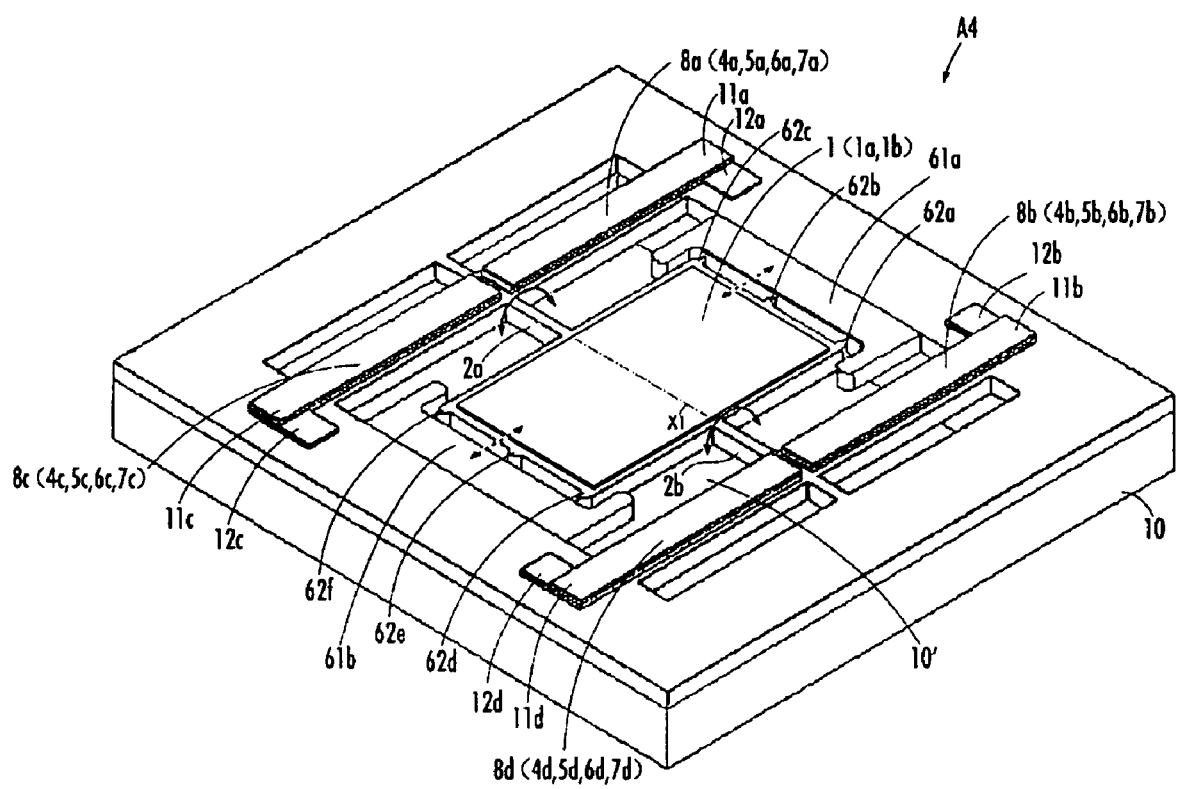
FIG. 5 is a perspective view of a configuration of an optical deflector according to a fourth embodiment.

A fourth embodiment of the present invention is explained with reference to FIG. 5. FIG. 5 is a perspective view which shows a configuration of the optical deflector A4 of the fourth embodiment. The optical deflector A4 is similar to the third embodiment except that the optical deflector A4 of the present embodiment has protruding parts in the mirror. The same reference numerals are used to indicate the same or like elements as in the first embodiment, and explanations of the same or like elements that have been explained above are not repeated below.

In the present embodiment, the mirror 1 has at least one (three on each side in FIG. 5) protruding parts (protrusions) 62a-62f on the two opposing sides of the mirror 1 that face the impact attenuators 61a, 61b, respectively. The protruding parts 62-62f are formed integrally with the mirror supporting body 1a by the patterning process of the semiconductor substrate.

The protruding parts 62a-62f are formed to such a size that the protruding parts do not interfere with the rotation of the mirror 1. Namely, in the normal operation condition in which the piezoelectric actuators 8a-8d are driven to rotate the mirror 1, the mirror 1 and the protruding parts 62a-62f do not make contact with the impact attenuator 61a, 61b, and they rotate about the axis of the torsion bars 2a, 2b. The effect of having the protruding parts in the mirror 1 on the device deflection/sweeping performance (the maximum deflection angle, etc.) is sufficiently small.

In abnormal operation conditions, such as when the mirror 1 abnormally vibrates in response to external impacts and vibrations, the mirror 1 makes contact with the impact attenuators, 61a, 61b, and the impact is weakened, thereby avoiding the breakage failure of the mirror 1, torsion bars 2a, 2b, and the impact attenuators 61a, 61b. In such a case, due to the protruding parts provided at portions of the mirror 1 that face the impact attenuators 61a, 61b, it is possible to avoid a sticktion caused by the mirror 1 being attached to the impact attenuators 61a, 61b, which are formed using a polymer material.

Therefore, in the optical deflector A4 of the present embodiment, by providing impact attenuators 61a, 61b, it is possible to weaken the abnormal vibrations and impacts and to avoid breakage failure effectively, without increasing the device size or sacrificing the device performance. Furthermore, in the present embodiment, it is possible to effectively avoid the deterioration of the deflection and sweeping/scanning performance due to undesired sticktion between the mirror 1 and the impact attenuator 61a, 61b.

The optical deflector A4 of the present embodiment has been actually manufactured and tested. An optical deflector manufactured included the protruding parts 62a-62f installed in the mirror 1 in addition to the structure of the third embodiment. In this working example of the optical deflector, the driving voltage was applied in the same way as in the first embodiment, and the maximum deflection angle of ±10° was obtained in the same way as in the first embodiment.

In the same way as in the first embodiment, external impacts and vibrations were applied to the optical deflector as tests. The test results showed that there was no breakage failure when the impact even at an acceleration of 1,400 G was applied, and the deflection deflector maintained its mechanical performance (deflection and sweeping characteristics). Also, there was no breakage failure even when an external vibration at an acceleration of 400 G was applied, and the deflection device maintained its mechanical performance (deflection and sweeping characteristics). Accordingly, in the fourth embodiment, a sticktion between the mirror 1 and the impact attenuator 61a, 61b was prevented, and a greater durability against external impacts and vibrations as compared to that in the third embodiment was achieved.

The optical deflectors of the first through fourth embodiments described above can be used in, for example, various image display devices such as the projection-type display systems, light scanning systems for image formation such as the xerographic copier or laser printers, etc., and in light scanning systems for sensing, such as laser radars, bar code readers and the area sensors.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What we claim are:

1. An optical deflector comprising:
a mirror having a reflective plane;
a pair of first torsion bars respectively extending outwardly from two opposing sides of said mirror, said pair of first torsion bars being substantially coaxial to each other to define a first rotational axis;
a movable frame surrounding said mirror;
a pair of first piezoelectric cantilevers disposed across said mirror from each other, each of the first piezoelectric cantilevers including a supporting body and a piezoelectric body formed on the supporting body, one end of the first piezoelectric cantilever being connected to said first torsion bar, the other end of the first piezoelectric cantilever being connected to said movable frame, said pair of first piezoelectric cantilevers, upon application of driving voltages to the respective piezoelectric bodies, exhibiting respective bending deformations due to piezoelectricity so as to rotate said pair of first torsion bars relative to the movable frame around the first rotational axis, thereby rotarily driving said mirror through said first torsion bars relative to the movable frame around the first rotational axis;
a first impact attenuator connected to said movable frame, the impact attenuator being disposed in a gap between said mirror and said movable frame;
a pair of second torsion bars respectively extending outwardly from two opposing sides of said movable frame, said pair of second torsion bars being substantially coaxial to each other to define a second rotational axis;
a support surrounding said movable frame;
a pair of second piezoelectric cantilevers disposed across said movable frame from each other, each of the second piezoelectric cantilevers including a supporting body and a piezoelectric body formed on the supporting body, one end of the second piezoelectric cantilever being connected to said second torsion bar, the other end of the second piezoelectric cantilever being connected to said support, said pair of second piezoelectric cantilevers, upon application of driving voltages to the respective piezoelectric bodies, exhibiting respective bending deformations due to piezoelectricity so as to rotate said pair of second torsion bars relative to the support around the second rotational axis, thereby rotarily driving said movable frame through said pair of second torsion bars relative to the support around the second rotational axis; and a second impact attenuator connected to said support, the second impact attenuator being disposed in a gap between said movable frame and said support.

2. The optical deflector according to claim 1, wherein the first rotational axis is different from the second rotational axis.

3. The optical deflector according to claim 2, wherein the first rotational axis is substantially perpendicular to the second rotational axis.

4. The optical deflector according to claim 1, wherein a driving voltage applied to one said first and second piezoelectric cantilevers are alternating current voltages.

5. The optical deflector according to claim 1, wherein said mirror, said movable frame, said first and second torsion bars, said supporting bodies of said first and second piezoelectric cantilevers are formed integrally with said support by patterning a semiconductor substrate.

6. The optical deflector according to claim 5, wherein said piezoelectric bodies of said first and second piezoelectric cantilevers are formed by patterning a single layer of a piezoelectric film formed over the semiconductor substrate.

7. The optical deflector according to claim 6, wherein the reflective plane of said mirror and electrodes of said first and second piezoelectric cantilevers are formed by a patterning process of a thin metal film that is formed over the semiconductor substrate.

* * * * *